United States Patent
Yung-Yao et al.

(10) Patent No.: US 9,646,902 B2
(45) Date of Patent: May 9, 2017

(54) PAIRED EDGE ALIGNMENT

(71) Applicant: Taiwan Semiconductor Manufacturing Company Limited, Hsin-Chu (TW)

(72) Inventors: Lee Yung-Yao, Zhubei (TW); Ying Ying Wang, Xin-Zhu (TW); Yi-Ping Hsieh, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 163 days.

(21) Appl. No.: 13/964,231

(22) Filed: Aug. 12, 2013

(65) Prior Publication Data

US 2015/0042994 A1  Feb. 12, 2015

(51) Int. Cl.
*G01B 11/02* (2006.01)
*H01L 23/00* (2006.01)
(Continued)

(52) U.S. Cl.
CPC ............ *H01L 23/00* (2013.01); *G03F 9/7046* (2013.01); *H01L 22/12* (2013.01); *H01L 22/20* (2013.01); *H01L 2924/0002* (2013.01)

(58) Field of Classification Search
CPC ......... H01L 2924/00; H01L 2924/0002; H01L 2924/00014; H01L 23/544; G03F 7/70633; G03F 9/7084; G03F 9/7088; G03F 9/708; G03F 7/70358; G03F 9/7003; G03F 9/7011; G03F 9/7046; G03F 9/00; G03F 9/7065; G03F 9/7015; G03F 7/70425; G03F 7/70616; G03F 7/70433; G03F 7/0002; G03F 7/7085; G03F 7/70733; G03F 9/70723; G03F 7/7075; G03F 7/70058;
(Continued)

(56) References Cited

U.S. PATENT DOCUMENTS 3,690,881 A * 9/1972 King ..................... G03F 9/00
430/22
4,545,683 A   10/1985 Markle
(Continued)

FOREIGN PATENT DOCUMENTS

JP    2006011425 A * 1/2006 ........... G02F 1/1337

OTHER PUBLICATIONS http://en.wikipedia.org/wiki/Semiconductor_device_fabrication (Jul. 2013).*
(Continued)

*Primary Examiner* — Tarifur Chowdhury
*Assistant Examiner* — Mohamad K Amara
(74) *Attorney, Agent, or Firm* — Cooper Legal Group, LLC

(57) ABSTRACT

Among other things, one or more systems and techniques for scanner alignment sampling are provided. A set of scan region pairs are defined along a periphery of a sampling area associated with a semiconductor wafer. Alignment marks are formed within scan regions of the set of scan region pairs, but are not formed within other regions of the sampling area. In this way, scan region pairs are scanned to determine alignment factors for respective scan region pairs. An alignment for the sampling area, such as layers or masks used to form patterns onto such layers, is determined based upon alignment factors determined for the scan region pairs.

20 Claims, 7 Drawing Sheets

(51) Int. Cl.
*H01L 21/66* (2006.01)
*G03F 9/00* (2006.01)

(58) Field of Classification Search
CPC .............. G03F 9/7038; G03F 7/70191; G03F 7/70283; G03F 1/20; G03F 1/26; G03F 7/70541; G03F 1/42; G03F 9/7042; G03F 9/7069; G03F 1/38; G03F 9/7076; Y10S 438/975; G01B 11/27; G01B 11/24; G01B 11/022
USPC .... 356/399–401, 153, 614, 620, 508, 237.4, 356/490, 485; 257/E23.179, 620, 797, 257/E23.194, 48, 758, E21.238; 438/401, 438/462, 975, 460, 14, 106; 250/548, 250/559.3, 491.1, 557, 559.29, 202; 430/5, 311

See application file for complete search history.

(56) References Cited

U.S. PATENT DOCUMENTS

| | | | |
|---|---|---|---|
| 4,893,163 A | 1/1990 | Rudeck | |
| 4,948,983 A | 8/1990 | Maruyama et al. | |
| 5,046,847 A * | 9/1991 | Nakata | G01N 21/94 250/559.41 |
| 5,106,432 A * | 4/1992 | Matsumoto | G03F 9/70 148/33.2 |
| 5,298,939 A * | 3/1994 | Swanson | G03F 7/70275 355/30 |
| 5,447,811 A * | 9/1995 | Buhr | H04N 1/407 347/101 |
| 5,545,593 A * | 8/1996 | Watkins et al. | 438/16 |
| 5,906,901 A * | 5/1999 | Tanimoto | G03F 7/70358 356/400 |
| 6,011,611 A * | 1/2000 | Nomura | G03F 7/706 355/53 |
| 6,238,851 B1 * | 5/2001 | Nishi | 430/394 |
| 6,266,144 B1 | 7/2001 | Li | |
| 6,319,641 B2 | 11/2001 | Magome | |
| 6,362,491 B1 * | 3/2002 | Wang et al. | 250/548 |
| 6,815,128 B2 * | 11/2004 | Rumsey et al. | 430/22 |
| 6,906,303 B1 * | 6/2005 | Smith | B82Y 10/00 250/208.1 |
| 7,381,503 B2 * | 6/2008 | Smith | G03F 7/70458 430/22 |
| 7,404,173 B2 * | 7/2008 | Wu | G06F 17/5068 430/22 |
| 7,442,951 B2 * | 10/2008 | Smith | B82Y 10/00 250/559.3 |
| 7,830,028 B2 | 11/2010 | Li et al. | |
| 8,138,498 B2 * | 3/2012 | Ghinovker | 257/48 |
| 8,164,736 B2 * | 4/2012 | Shibazaki | G03F 7/70258 355/52 |
| 9,104,109 B2 * | 8/2015 | Fujimura | H01J 37/3174 |
| 2001/0001056 A1 * | 5/2001 | Magome | 430/22 |
| 2003/0202174 A1 * | 10/2003 | Smith | G03F 7/70558 356/124 |
| 2004/0137341 A1 * | 7/2004 | Niu | G03F 7/70633 430/5 |
| 2005/0219484 A1 | 10/2005 | Chiang et al. | |
| 2008/0254645 A1 * | 10/2008 | Taniguchi | G03F 7/70125 438/795 |
| 2010/0005442 A1 | 1/2010 | Ghinovker et al. | |
| 2010/0078769 A1 * | 4/2010 | West et al. | 257/620 |
| 2011/0096317 A1 * | 4/2011 | Stuetzle | G03F 7/70066 355/71 |

OTHER PUBLICATIONS http://www.eetimes.com/author.asp?section_id=36&doc_id=1265899 (2010).*
http://www-03.ibm.com/press/us/en/pressrelease/33405.wss (2011).*
"An Empirical Approach Addressing the Transfer of Mask Placement Errors During Exposure", B. Alles, E. Cotte and B. Schulz, 2007, 23rd European Mask and Lithography Conference, Proc. of SPIE, vol. 6533, reprinted from the Internet at: http://amtc.amtc-dresden.com/content/dls/EMLC2007_paper_v4.pdf, 10 pgs.
"Alignment system", Makiko Mori, Shunichi Uzawa, Kinitaka Ozawa, Hirohisa Ohta, Nose Noriyuki, Jul. 9, 2013, reprinted from the Internet at http://www.devileye.net/catalog/office_machine/alignment_system.html, 14 pgs.

* cited by examiner

PAIRED EDGE ALIGNMENT

BACKGROUND

In semiconductor fabrication, one or more masks are used to form patterns onto layers of a semiconductor wafer. In an embodiment of lithography, a light sensitive resist coating is formed over one or more layers to which a pattern is to be transferred. The resist coating is patterned by exposing the resist coating to radiation such as light that selectively passes through an intervening mask comprising the pattern. The radiation causes the exposed or unexposed portions of the resist coating to become more or less soluble. A developer is used to remove relatively more soluble areas leaving a patterned resist. The patterned resist can serve as template for an underlying layer that can be selectively etched. Once the underlying layer is treated, the patterned resist is removed leaving a treated layer corresponding to the pattern. Masks, such as those used in lithography, and layers onto which patterns are formed using such masks should align so that devices, such as integrated circuit, are properly formed within the semiconductor layer and function as intended. In an embodiment, if a via within an interconnect layer is misaligned with a first metal structure within a metal one layer and a second metal structure within a metal two layer, then the via will not form a conductive path that should have been formed between the first metal structure and the second metal structure. Accordingly, alignment marks are used to align masks or layers, and overlay marks are used to evaluate accuracy of such alignment.

DETAILED DESCRIPTION

Figure 1:
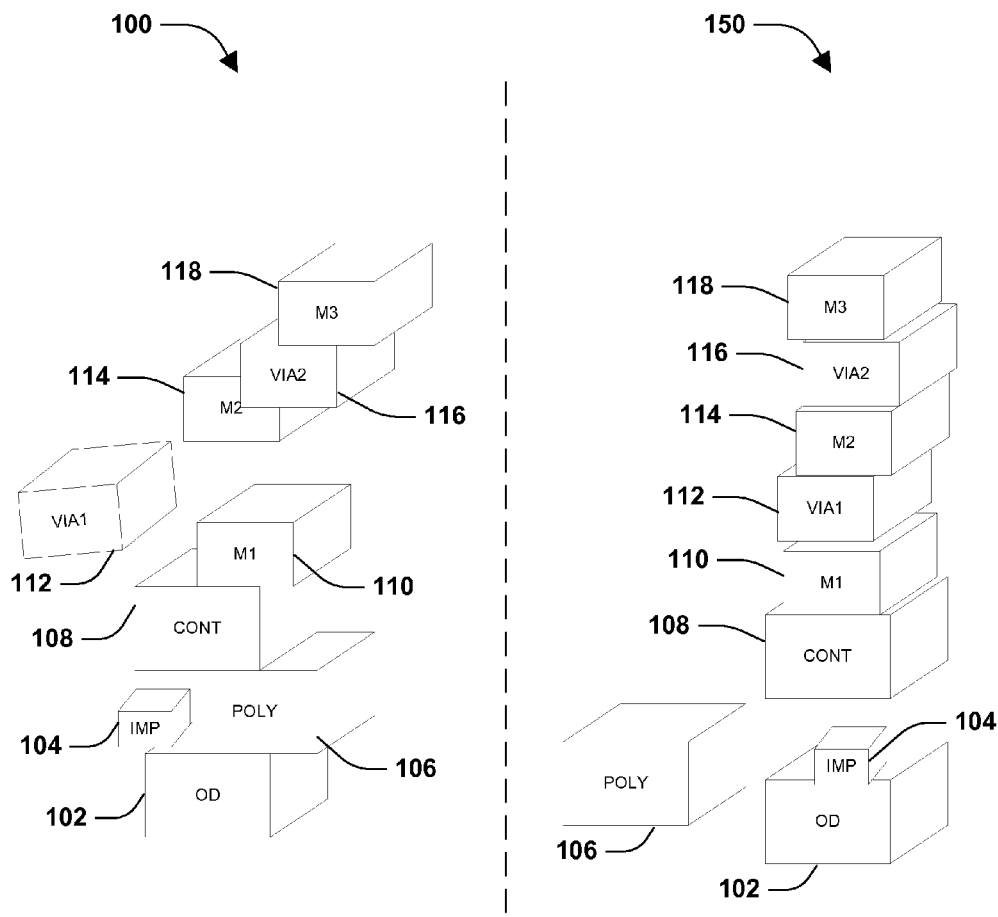
FIG. 1 is an illustration of one or more misaligned layers of a semiconductor wafer and an illustration of one or more aligned layers of the semiconductor wafer, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more systems and techniques for scanner alignment sampling are provided herein. For example, one or more scan region pairs are defined along a periphery of a sampling area associated with a semiconductor wafer. The one or more scan region pairs are marked with alignment marks used to determine alignment of layers or masks associated with the semiconductor wafer. That is, as opposed to marking the entire sampling area or random portions of the sampling area with alignment marks, merely regions along the periphery of the sampling area are marked, thus resulting in a reduced sampling set of alignment marks for evaluation during an alignment scan of the semiconductor wafer by a scanner. In an embodiment, the one or more scan region pairs correspond to alignment marks within 32 regions out of 70 regions of the sampling area. Obtaining a relatively accurate alignment can result in desirable overlay between layers (OVL). Scanning the one or more scan region pairs can reduce OVL residual and improve semiconductor output such as wafers per hour (WPH). In this way, alignment of layers or masks used to form patterns onto such layers is determined based upon scanning alignment marks within the one or more scan region pairs. In an embodiment, the alignment can be used for semiconductor wafers corresponding to 20 nm or smaller nodes.

FIG. 1 illustrates an embodiment 100 of one or more misaligned layers of a semiconductor wafer and an embodiment 150 of one or more aligned layers of the semiconductor wafer. In embodiment 100, a first layer comprises an oxide diffusion (OD) structure 102, a second layer comprises an IMP structure 104 and a polysilicon structure 106, a third layer comprises a CONT structure 108, a fourth layer such as a metal one layer comprises a metal (1) structure 110, a fifth layer such as a first interconnect layer comprises a via (1) structure 112, a sixth layer such as a metal two layer comprises a metal (2) structure 114, a seventh layer such as a second interconnect layer comprises a via (2) structure 116, and an eighth layer such as a metal three layer comprises a metal (3) structure 118. In embodiment 100, one or more layers and structures are misaligned, which results in improper formation of devices within the semiconductor wafer that can affect functionality of such devices. In an embodiment, the via (1) structure 112 is formed to connect, such as create a conductive path between, the metal (1) structure 110 and the metal (2) structure 114. However, the via (1) structure 112 is misaligned with respect to the metal (1) structure 110 and the metal (2) structure 114, and thus does not form the conductive path that would otherwise electrically connect the metal (1) structure 110 and the metal (2) structure 114.

In embodiment 150, the one or more layers of the semiconductor wafer are aligned, at least to an improved degree relative the embodiment 100. In an embodiment, the via (1) structure 112 is aligned with the metal (1) structure 110 and the metal (2) structure 114. Because the via (1) structure 112 is properly aligned, the via (1) structure 112 forms a conductive path between the metal (1) structure and the metal (2) structure 114. To aid in achieving the alignment illustrated in example 150, alignment marks are used to aligning layers or masks used to form patterns onto such layers of the semiconductor wafer.

Figure 2:
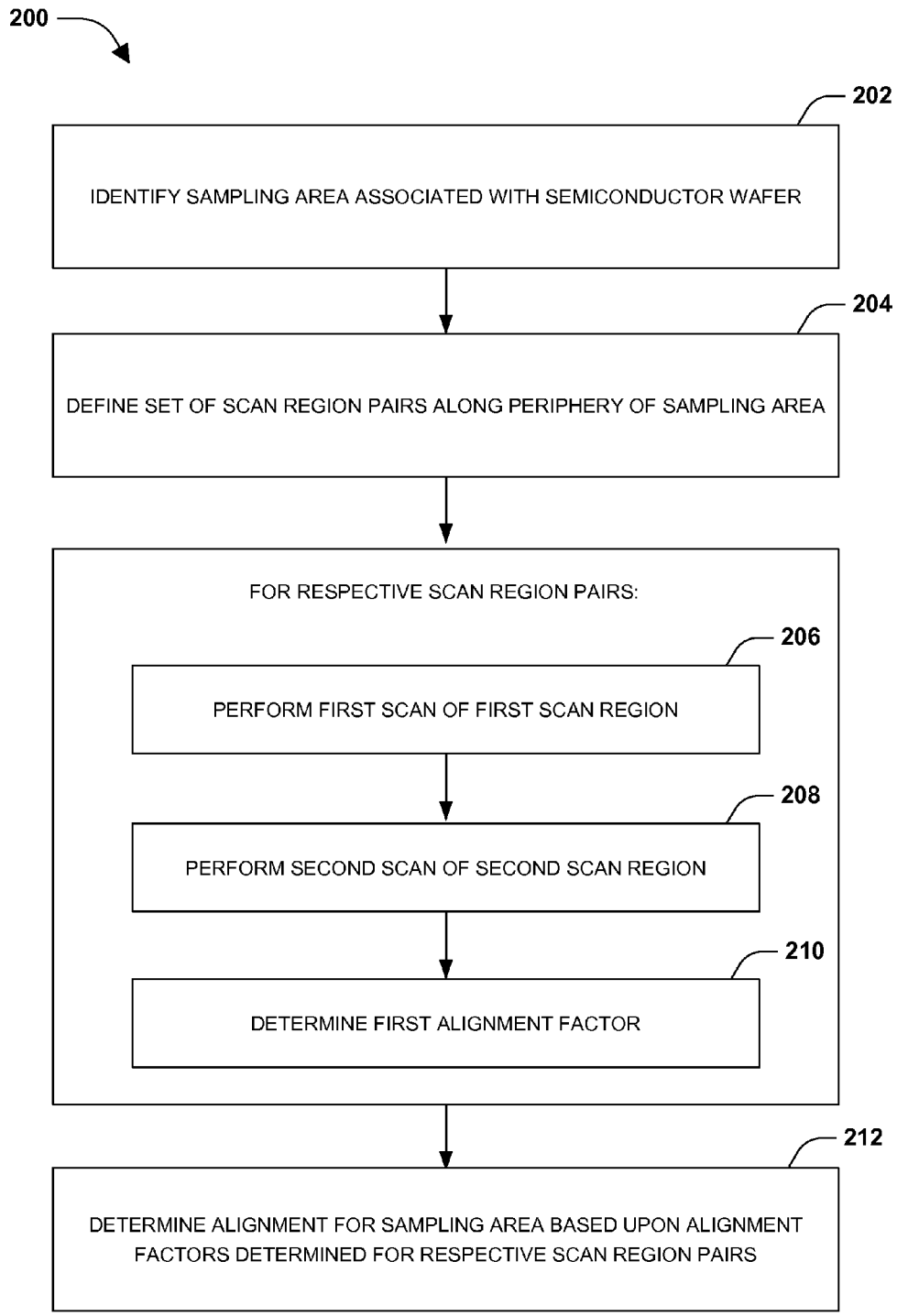
FIG. 2 is a flow diagram illustrating a method of scanner alignment sampling, according to some embodiments.

A method 200 of scanner alignment sampling is illustrated in FIG. 2. At 202, a sampling area associated with a semiconductor wafer is identified. The sampling area comprises a plurality of regions corresponding to portions of the semiconductor wafer. In an embodiment, a region corresponds to one or more patterns or a portion thereof. At 204, a set of scan region pairs are defined along a periphery of the sampling area. In an embodiment, a first scan region pair comprises a first scan region corresponding to a first region of the sampling area, and comprises a second scan region corresponding to a second region of the sampling area. In an embodiment, the first scan region is adjacent to the second scan region. In another embodiment, the first scan region and the second scan region are selected as a vertical pairing where the first scan region is vertically aligned with the second scan region. In another embodiment, the first scan region and the second scan region are selected as a horizontal pairing where the first scan region is horizontally aligned with the second scan region. Alignment marks are formed within scan regions of the set of scan region pairs. In an embodiment, a first alignment mark is formed within the first scan region of the first scan region pair, a second alignment mark is formed within the second scan region of the first scan region pair, a third alignment mark is formed within a third scan region of a second scan region pair, a fourth alignment mark is formed within a fourth scan region of the second scan region pair, etc. In an embodiment, the alignment marks comprise a similar alignment marking pattern such as a cross pattern, a circle pattern, or any other shape/object pattern that can be identified by a scanner. In an embodiment, a layer one alignment mark within a first layer comprises a cross pattern and a layer two alignment mark within a second layer comprises the cross pattern, such that the layer one alignment mark and the layer two alignment mark are evaluated against one another to determine an alignment factor for the first layer and the second layer. An amount of overlap between the layer one alignment mark and the layer two alignment mark is used to determine an amount of alignment between the first layer and the second layer. More overlap corresponds to better alignment. In another embodiment, one or more alignment marks comprise different alignment marking patterns.

In an embodiment, a center non-pairing region is defined within the sampling area. The center non-pairing region corresponds to regions of the sampling area that are not along the periphery of the sampling area, such as regions within a center portion of the semiconductor wafer surrounded by the set of scan region pairs. The center non-pairing region is designated as ineligible for inclusion within the set of scan region pairs. That is, alignment marks are not formed within regions of the sampling area corresponding to the center non-pairing region. In this way, a reduced sampling set of regions, corresponding to merely the set of scan region pairs and not the center non-pairing region, are marked with alignment marks for alignment scanning. In an embodiment, the sampling area comprises a region count corresponding to a number of regions within the sampling area, such as about 70 regions. An alignment count between about 25% to about 75% of the region count is specified. The alignment count corresponds to a number of regions to be paired as scan regions for inclusion within the set of scan region pairs. That is, the set of scan region pairs correspond to between about 25% to about 75% of the sampling area.

The sampling area is scanned for alignment marks, which are formed within scan regions of the set of scan region pairs. In an embodiment, the sampling area is scanned in a row by row manner. A first row scan of a first row starts at a first side, such as a left side of the first row, and scans from the first side to a second side, such as a right side of the first row. After the first row scan, a second row scan of a second row starts at the second side of the second row and scans to the first side of the second row. In this way, the scan follows a winding path. In an embodiment of scanning a scan region pair of the set of scan region pairs, a first scan of the first scan region of the first scan region pair is performed to obtain a first scan result, at 206. The first scan result corresponds to one or more alignment marks formed within the first scan region, such as a first alignment mark formed within a first layer corresponding to the first scan region and a second alignment mark formed within a second layer corresponding to the first scan region. In an embodiment, a plurality of layers or masks correspond to the first scan region, such as a third layer, a fourth layer, or any other number of layers. The first scan result indicates a degree of alignment between the first layer and the second layer based upon an amount of detected alignment between the first alignment mark and the second alignment mark by the first scan. At 208, a second scan of the second scan region of the first scan region pair is performed to obtain a second scan result. The second scan result corresponds to one or more alignment marks formed within the second scan region, such as a third alignment mark formed within the first layer corresponding to the second scan region and a fourth alignment mark formed within the second layer corresponding to the second scan region. In an embodiment, a plurality of layers or masks correspond to the first scan region, such as a third layer, a fourth layer, or any other number of layers. The second scan result indicates a degree of alignment between the first layer and the second layer based upon an amount of detected alignment between the third alignment mark and the fourth alignment mark.

In an embodiment, the first scan is performed in a first direction and the second scan is performed in a second direction different than the first direction. In an embodiment, the first direction is substantially opposite the second direction, such as the first direction corresponding to an up scan in a +Y direction and the second direction corresponding to a down scan in a −Y direction. At 210, a first alignment factor is determined based upon the first scan result and the second scan result. The first alignment factor indicates a degree of alignment or misalignment between one or more layers or masks corresponding to the first scan region and the second scan region of the first scan region pair. In this way, alignment factors are determined for respective scan region pairs within the set of scan region pairs. At 212, an alignment for the sampling area is determined based upon the alignment factors determined for the scan region pairs. The alignment corresponds to an overall alignment of layers or masks corresponding to the sampling area. Because the set of scan region pairs along the periphery of the sampling area are marked with alignment marks, as opposed to the entire sampling area or a random selection of the sampling area, OVL residual is reduced, an alignment count of alignment marks is reduced such as a sampling set between about 25% to 75% of the sampling area, and wafers per hour (WPH) are improved. In an embodiment, the alignment is determined for about a 20 nm or smaller node.

Figure 3A:
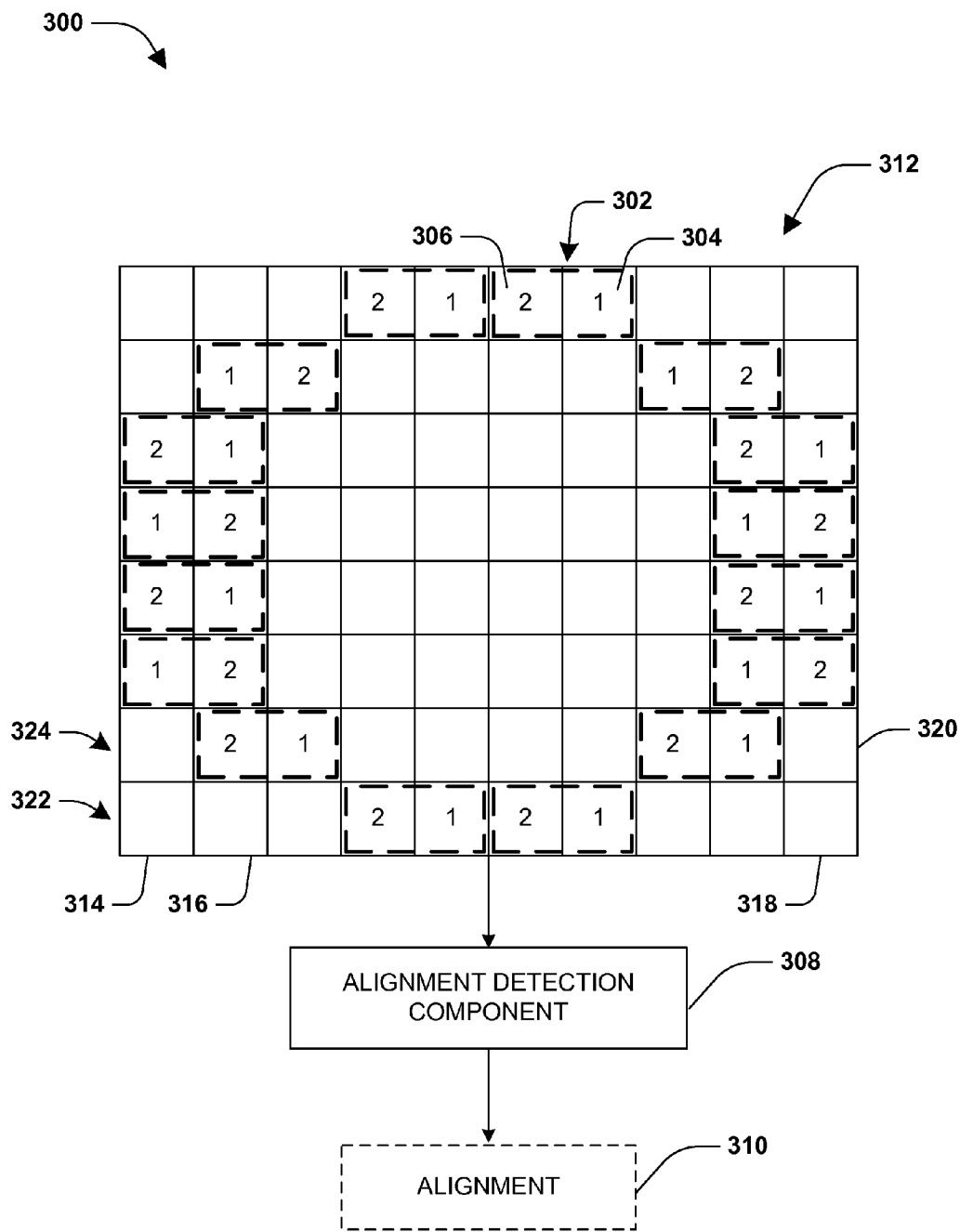
FIG. 3A is an illustration of a system for scanner alignment sampling, according to some embodiments.

FIG. 3A illustrates a system 300 for scanner alignment sampling. The system 300 comprises an alignment detection component 308 associated with a sampling area 312 for a semiconductor wafer. The sampling area 312 comprises a plurality of regions, such as a first region 314, a second region 316, a tenth region 318, an eleventh region 320, etc. Such regions are illustrated as squares merely for illustrative purposes. The alignment detection component 308 is configured to form alignment marks within a subset of regions within the sampling area 312. In an embodiment, the alignment detection component 308 is configured to define one or more scan region pairs within which alignment marks are to be formed or evaluated. The one or more scan region pairs are defined along a periphery of the sampling area 312. A first scan region pair 302 comprises a first scan region 304, represented by a "1" for illustrative purposes, and a second scan region 306 represented by a "2" for illustrative purposes. A first alignment mark is formed within the first scan region 304 and a second alignment mark is formed within the second scan region 306. Alignment marks are not formed within regions of the sampling area 312 that are not illustrated with numerical identifiers such as "1" or "2". In this way, alignment marks are formed within regions along the periphery of the sampling area 312 according to pairings of regions where a scan region pair comprises a region represented by a "1" and a region represented by a "2". In an embodiment, 2 scan region pairs are formed per row of the sampling area 312. In an embodiment, a scan region pair comprises 2 adjacent scan regions. In an embodiment, a scan region pair corresponds to a horizontal pairing of horizontally aligned scan regions, illustrated in FIG. 3A, or a vertical pairing of vertically aligned scan regions, not illustrated.

The alignment detection component 308 is configured to scan the sampling area 312 for alignment marks to determine an alignment 310 for the sampling area 312, such as an alignment associated with one or more layers or masks within the sampling area 312. In an embodiment, the alignment detection component 308 is configured to scan according to a row by row manner, such as starting at the first region 314, then the second region 316, and then the remaining regions of the first row 322 to the tenth region 318. After scanning the first row 322, the alignment detection component 308 starts scanning the second row 324 starting with the eleventh region 320. In this way, the alignment detection component 308 scans the sampling area 312 in row by row manner according to a winding scan path. Because alignment marks are merely formed within the scan region pairs, as opposed to the entire sampling area 312, the alignment detection component 308 evaluates a reduced set of alignment marks when determining the alignment 310. Evaluating alignment marks within the scan region pairs along the periphery of the sampling area 312 provides a comprehensive alignment analysis for the sampling area 312, which can reduce OVL residual, increase alignment detection quality, and increase wafer per hour (WPH).

Figure 3B:
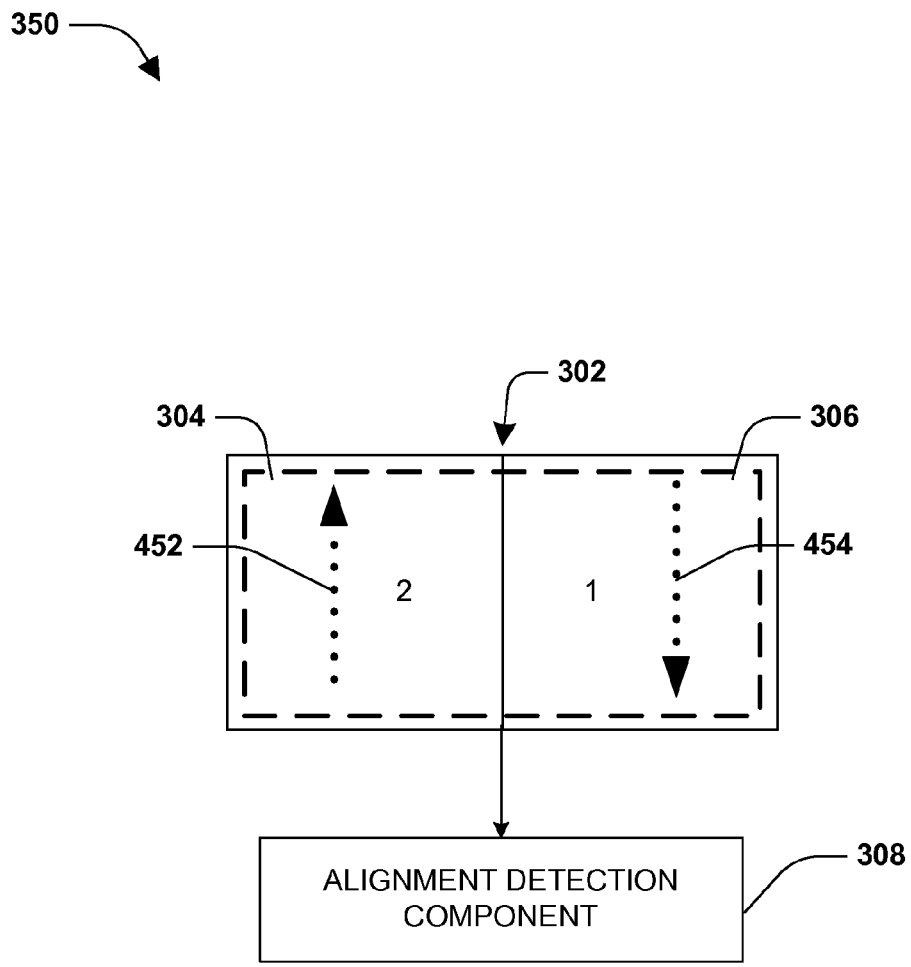
FIG. 3B is an illustration of performing a first scan and a second scan for a first scan region pair, according to some embodiments.

In an embodiment, the alignment detection component 308 scans the first scan region pair 302, as illustrated in example 350 of FIG. 3B. The alignment detection component 308 performs a first scan 454 of the first scan region 306 of the first scan region pair 302 to obtain a first scan result. The alignment detection component 308 perform a second scan 452 of the second scan region 304 of the first scan region pair 302 to obtain a second scan result. In an embodiment, the first scan 454 is performed in a first direction and the second scan 452 is performed in a second direction different than the first direction. In an embodiment, the first direction corresponds to a down scan in a −Y direction and the second direction corresponds to an up scan in a +Y direction. It is appreciated that various scan patterns are contemplated herein. The alignment detection component 308 determines a first alignment factor based upon the first scan result and the second scan result. The alignment detection component 308 is configured to determine the alignment 310 based upon alignment factors determined by scanning scan region pairs within the sampling area 312.

Figure 4:
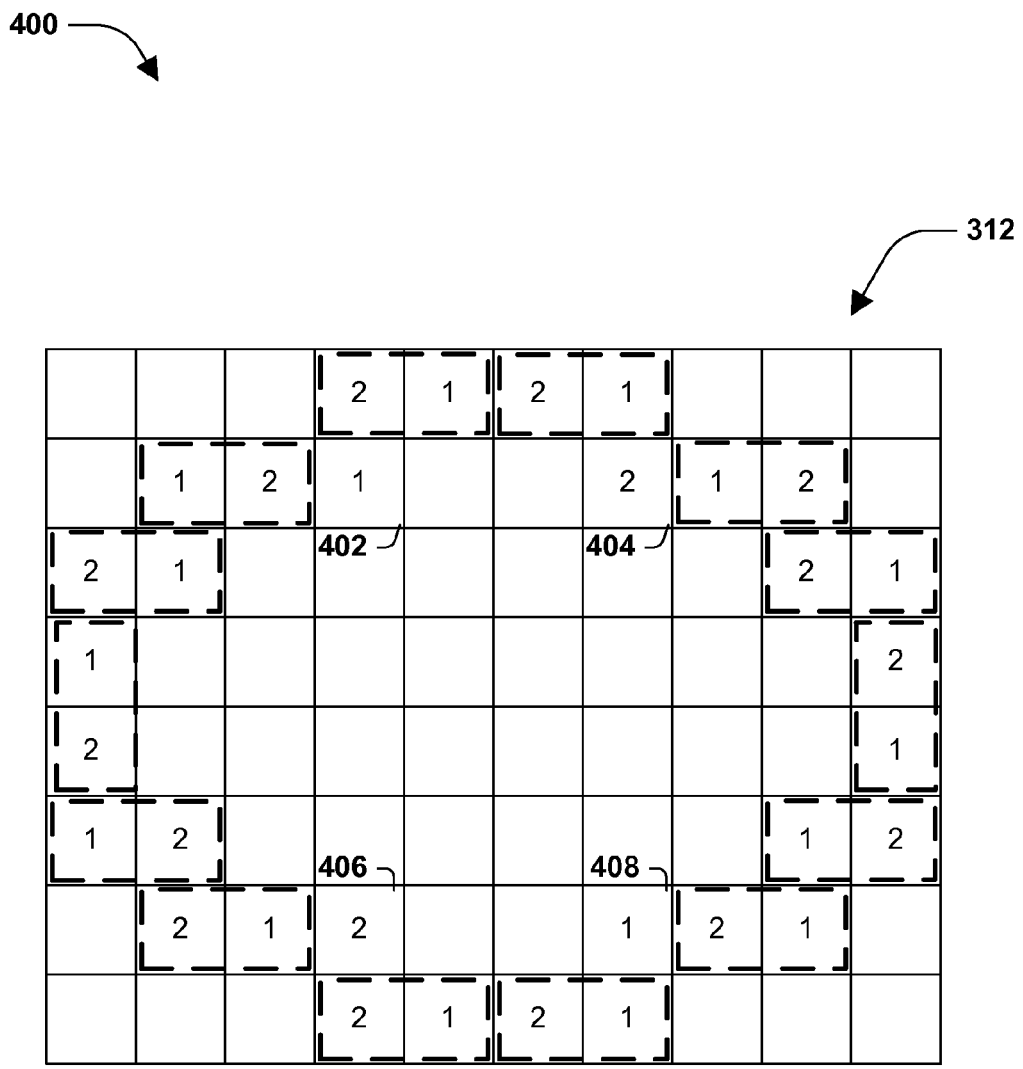
FIG. 4 is an illustration of a second set of scan region pairs that encompass a contiguous circular region along a periphery of a sampling area associated with a semiconductor wafer, according to some embodiments.

FIG. 4 illustrates an embodiment 400 of a second set of scan region pairs that encompass a contiguous circular region along a periphery of the sampling area 312 associated with a semiconductor wafer. In an embodiment, the second set of scan region pairs comprise the set of scan region pairs of FIG. 3A and one or more additional scan regions, such as a first additional scan region 402, a second additional scan region 404, a third additional scan region 406, and a fourth additional scan region 408. In this way, the second set of scan region pairs comprises regions of the sampling area 312 that encompass the contiguous circular region along the periphery of the sampling area 312. Alignment marks are formed within the second set of scan region pairs, and are evaluated during a scan of the sampling area 312 to determine an alignment for one or more layers or masks associated with the semiconductor wafer.

According to an aspect of the instant disclosure, a method for scanner alignment sampling is provided. The method comprises identifying a sampling area associated with a semiconductor wafer. The sampling area comprises a plurality of regions. A set of scan region pairs along a periphery of the sampling area is defined. Respective scan region pairs within the set of scan region pairs are scanned to determine alignments factors used to determine an alignment for the sampling area. In an embodiment, a first scan of a first scan region of a first scan region pair is performed to obtain a first scan result. A second scan of a second scan region of the first scan region pair is performed to obtain a second scan result. A first alignment factor is determined based upon the first scan result and the second scan result. An alignment for the sampling area is determined based upon alignment factors determined for respective scan region pairs.

According to an aspect of the instant disclosure, a system for scanner alignment sampling is provided. The system comprises an alignment detection component configured to define one or more scan region pairs along a periphery of a sampling area associated with the semiconductor wafer. The one or more scan region pairs are defined for scanning used to determine an alignment for the sampling area. In an embodiment, alignment marks are formed within scan regions of the scan region pairs, but are not formed in other regions of the sampling area.

According to an aspect of the instant disclosure, a method for scanner alignment sampling is provided. The method comprises evaluating scan region pairs along a periphery of a sampling area associated with a semiconductor wafer. In an embodiment, a first scan of a first scan region of a first scan region pair is performed in a first direction to obtain a first scan result. A second scan of a second scan region of the first scan region pair is performed in a second direction, different than the first direction, to obtain a second scan result. A first alignment factor is determined based upon the first scan result and the second scan result. An alignment for the sampling area is determined based upon alignment factors determined for respective scan region pairs.

Figure 5:
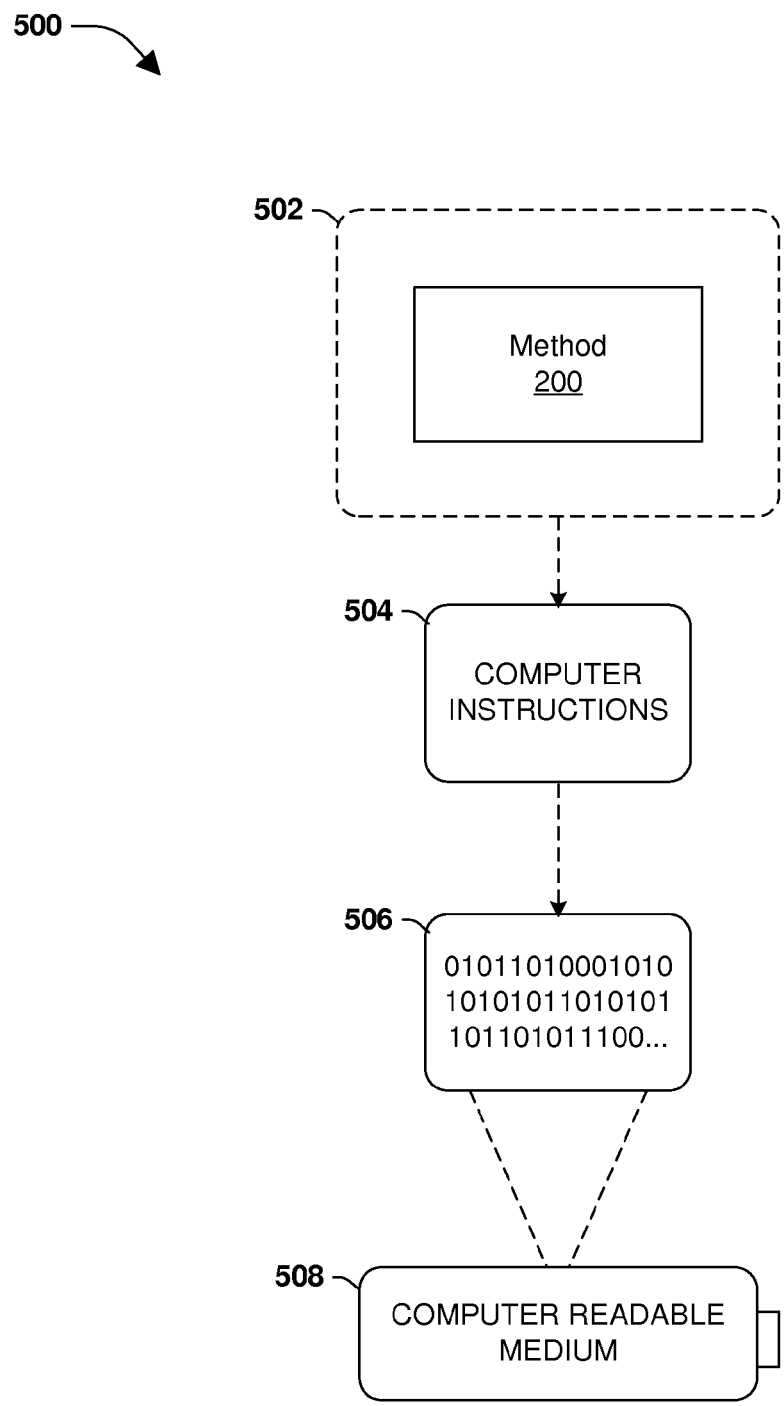
FIG. 5 is an illustration of an example computer-readable medium wherein processor-executable instructions configured to embody one or more of the provisions set forth herein can be comprised.

Still another embodiment involves a computer-readable medium comprising processor-executable instructions configured to implement one or more of the techniques presented herein. An example embodiment of a computer-readable medium or a computer-readable device is illustrated in FIG. 5, wherein the implementation 500 comprises a computer-readable medium 508, such as a CD-R, DVD-R, flash drive, a platter of a hard disk drive, etc., on which is encoded computer-readable data 506. This computer-readable data 506, such as binary data comprising at least one of a zero or a one, in turn comprises a set of computer instructions 504 configured to operate according to one or more of the principles set forth herein. In some embodiments, the processor-executable computer instructions 504 are configured to perform a method 502, such as at least some of the exemplary method 200 of FIG. 2, for example. In some embodiments, the processor-executable instructions 504 are configured to implement a system, such as at least some of the exemplary system 300 of FIG. 3A, for example. Many such computer-readable media are devised by those of ordinary skill in the art that are configured to operate in accordance with the techniques presented herein.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing at least some of the claims.

As used in this application, the terms "component", "module," "system", "interface", and the like are generally intended to refer to a computer-related entity, either hardware, a combination of hardware and software, software, or software in execution. For example, a component can be, but is not limited to being, a process running on a processor, a processor, an object, an executable, a thread of execution, a program, or a computer. By way of illustration, both an application running on a controller and the controller can be a component. One or more components reside within a process or thread of execution, in some embodiments. A component is localized on one computer or distributed between two or more computers, in some embodiments.

Furthermore, the claimed subject matter is implemented as a method, apparatus, or article of manufacture using standard programming or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications can be made to this configuration without departing from the scope or spirit of the claimed subject matter.

Figure 6:
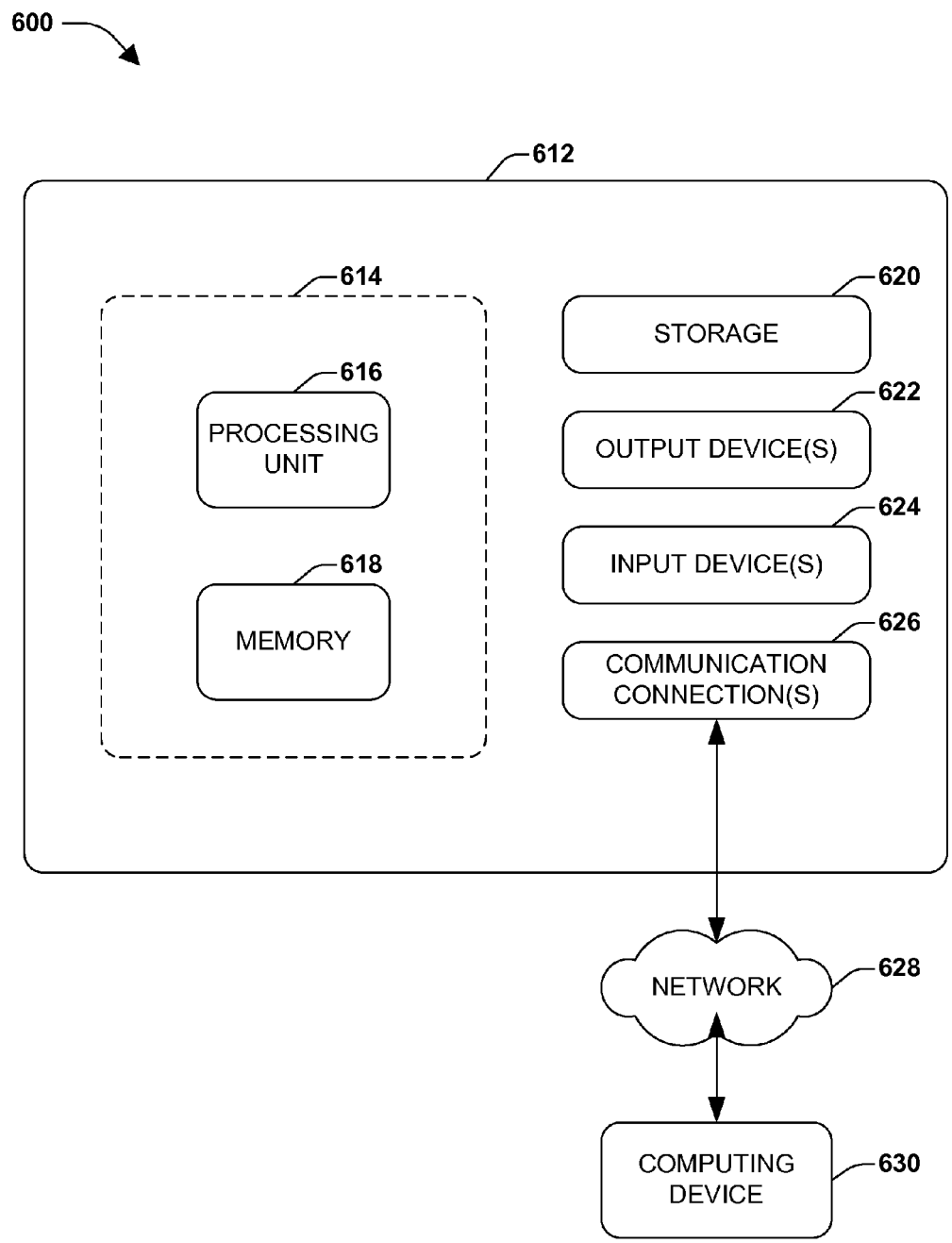
FIG. 6 illustrates an example computing environment wherein one or more of the provisions set forth herein can be implemented.

FIG. 6 and the following discussion provide a brief, general description of a suitable computing environment to implement embodiments of one or more of the provisions set forth herein. The operating environment of FIG. 6 is only one example of a suitable operating environment and is not intended to suggest any limitation as to the scope of use or functionality of the operating environment. Example computing devices include, but are not limited to, personal computers, server computers, hand-held or laptop devices, mobile devices, such as mobile phones, Personal Digital Assistants (PDAs), media players, and the like, multiprocessor systems, consumer electronics, mini computers, mainframe computers, distributed computing environments that include any of the above systems or devices, and the like.

Generally, embodiments are described in the general context of "computer readable instructions" being executed by one or more computing devices. Computer readable instructions are distributed via computer readable media as will be discussed below. Computer readable instructions are implemented as program modules, such as functions, objects, Application Programming Interfaces (APIs), data structures, and the like, that perform particular tasks or implement particular abstract data types. Typically, the functionality of the computer readable instructions are combined or distributed as desired in various environments.

FIG. 6 illustrates an example of a system 600 comprising a computing device 612 configured to implement one or more embodiments provided herein. In one configuration, computing device 612 includes at least one processing unit 616 and memory 618. In some embodiments, depending on the exact configuration and type of computing device, memory 618 is volatile, such as RAM, non-volatile, such as ROM, flash memory, etc., or some combination of the two. This configuration is illustrated in FIG. 6 by dashed line 614.

In other embodiments, device 612 includes additional features or functionality. For example, device 612 also includes additional storage such as removable storage or non-removable storage, including, but not limited to, magnetic storage, optical storage, and the like. Such additional storage is illustrated in FIG. 6 by storage 620. In some embodiments, computer readable instructions to implement one or more embodiments provided herein are in storage 620. Storage 620 also stores other computer readable instructions to implement an operating system, an application program, and the like. Computer readable instructions are loaded in memory 618 for execution by processing unit 616, for example.

The term "computer readable media" as used herein includes computer storage media. Computer storage media includes volatile and nonvolatile, removable and non-removable media implemented in any method or technology for storage of information such as computer readable instructions or other data. Memory 618 and storage 620 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 612. Any such computer storage media is part of device 612.

Device 612 includes communication connection(s) 626, in some embodiments, that allows device 612 to communicate with other devices. Communication connection(s) 626 includes, but is not limited to, a modem, a Network Interface Card (NIC), an integrated network interface, a radio frequency transmitter/receiver, an infrared port, a USB connection, or other interfaces for connecting computing device 612 to other computing devices. Communication connection(s) 626 includes a wired connection or a wireless connection in some embodiments. Communication connection(s) 626 transmits and/or receives communication media in some embodiments.

The term "computer readable media" includes communication media. Communication media typically embodies computer readable instructions or other data in a "modulated data signal" such as a carrier wave or other transport mechanism and includes any information delivery media. The term "modulated data signal" includes a signal that has one or more of its characteristics set or changed in such a manner as to encode information in the signal.

Device 612 includes input device(s) 624 such as keyboard, mouse, pen, voice input device, touch input device, infrared cameras, video input devices, or any other input device. Output device(s) 622 such as one or more displays, speakers, printers, or any other output device are also included in device 612. Input device(s) 624 and output device(s) 622 are connected to device 612 via a wired connection, wireless connection, or any combination thereof. In some embodiments, an input device or an output device from another computing device are used as input device(s) 624 or output device(s) 622 for computing device 612. Device 612 also includes communication connection(s) 626 to facilitate communications with one or more other devices.

Components of computing device 612 are connected by various interconnects, such as a bus. Such interconnects include a Peripheral Component Interconnect (PCI), such as PCI Express, a Universal Serial Bus (USB), firewire (IEEE 1394), an optical bus structure, and the like. In another embodiment, components of computing device 612 are interconnected by a network. For example, memory 618 is comprised of multiple physical memory units located in different physical locations interconnected by a network.

Storage devices utilized to store computer readable instructions are distributed across a network in some embodiments. For example, a computing device 630 accessible via a network 628 stores computer readable instructions to implement one or more embodiments provided herein. Computing device 612 accesses computing device 630 and downloads a part or all of the computer readable instructions for execution. Alternatively, computing device 612 downloads pieces of the computer readable instructions, as needed, or some instructions are executed at computing device 612 and some at computing device 630.

Various operations of embodiments are provided herein. The order in which some or all of the operations are described should not be construed as to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure could have been disclosed with respect to only one of several implementations, such feature can be combined with one or more other features of the other implementations as desired and advantageous for any given or particular application.

What is claimed is:

1. A method for scanner alignment sampling, comprising:
forming a plurality of alignment marks within a periphery of a first layer and a second layer;
identifying a sampling area associated with a semiconductor wafer and comprising the plurality of alignment marks, the sampling area divided into a plurality of scan regions;
defining a set of scan region pairs within the plurality of scan regions;
for a first scan region pair within the set of scan region pairs:
  performing a first scan of a first scan region of the first scan region pair in a first direction to obtain a first scan result, wherein:
    the first scan region comprises a first portion of the first layer and a first portion of the second layer, and
    the first scan result describes a degree of alignment between a first alignment mark in the first portion of the first layer and a second alignment mark in the first portion of the second layer;
  performing a second scan of a second scan region of the first scan region pair in a second direction, different than the first direction, to obtain a second scan result, wherein:
    the second scan region comprises a second portion of the first layer and a second portion of the second layer, and
    the second scan result describes a degree of alignment between a third alignment mark in the second portion of the first layer and a fourth alignment mark in the second portion of the second layer; and
  determining a first alignment factor for the first scan region pair based upon the first scan result and the second scan result;
for a second scan region pair within the set of scan region pairs:
  performing a third scan of a third scan region of the second scan region pair in the first direction to obtain a third scan result, wherein:
    the third scan region comprises a third portion of the first layer and a third portion of the second layer, and
    the third scan result describes a degree of alignment between a fifth alignment mark in the third portion of the first layer and a sixth alignment mark in the third portion of the second layer;
  performing a fourth scan of a fourth scan region of the second scan region pair in the second direction to obtain a fourth scan result, wherein:
    the fourth scan region comprises a fourth portion of the first layer and a fourth portion of the second layer, and
    the fourth scan result describes a degree of alignment between a seventh alignment mark in the fourth portion of the first layer and an eighth alignment mark in the fourth portion of the second layer; and
determining a second alignment factor for the second scan region pair based upon the third scan result and the fourth scan result; and
determining an alignment for the sampling area after the determining a first alignment factor and after the determining a second alignment factor, wherein the alignment for the sampling area is based upon the first alignment factor and the second alignment factor.

2. The method of claim 1, wherein the defining a set of scan region pairs comprises:
selecting the first scan region and the second scan region for pairing within the first scan region pair based upon a determination that the first scan region is adjacent to the second scan region.

3. The method of claim 1, wherein the defining a set of scan region pairs comprises:
selecting the first scan region and the second scan region for pairing within the first scan region pair as a horizontal pairing.

4. The method of claim 1, wherein the defining a set of scan region pairs comprises:
selecting the first scan region and the second scan region for pairing within the first scan region pair as a vertical pairing.

5. The method of claim 1, wherein the first scan region is in contact with the second scan region.

6. The method of claim 1, wherein the first direction is substantially opposite the second direction.

7. The method of claim 1, wherein alignment marks are not formed within a center region of the first layer and the second layer.

8. The method of claim 1, wherein the defining a set of scan region pairs comprises:
defining the set of scan region pairs to encompass a contiguous circular region along the periphery.

9. The method of claim 1, wherein the sampling area comprises a region count corresponding to a number of regions within the sampling area, and the defining a set of scan region pairs comprises:
specifying an alignment count between about 25% to about 75% of the region count, the alignment count corresponding to a number of regions to be paired as scan regions for inclusion within the set of scan region pairs.

10. The method of claim 1, wherein the determining an alignment comprises:
determining the alignment for a 20 nm node or smaller.

11. A method for scanner alignment sampling, comprising:
forming a plurality of alignment marks within a periphery of a first layer and a second layer;
defining a first scan region pair and a second scan region pair along the periphery;
performing a first scan of a first scan region of the first scan region pair in a first direction to obtain a first scan result describing a degree of alignment between a first alignment mark in a first portion of the first layer that is within the first scan region and a second alignment mark in a first portion of the second layer that is within the first scan region;
performing a second scan of a second scan region of the first scan region pair in a second direction to obtain a second scan result describing a degree of alignment between a third alignment mark in a second portion of the first layer that is within the second scan region and a fourth alignment mark in a second portion of the second layer that is within the second scan region;
determining a first alignment factor based upon the first scan result and the second scan result;
performing a third scan of a third scan region of the second scan region pair in the first direction to obtain a third scan result describing a degree of alignment between a fifth alignment mark in a third portion of the first layer that is within the third scan region and a sixth alignment mark in a third portion of the second layer that is within the third scan region;
performing a fourth scan of a fourth scan region of the second scan region pair in the second direction to obtain a fourth scan result describing a degree of alignment between a seventh alignment mark in a fourth portion of the first layer that is within the fourth scan region and an eighth alignment mark in a fourth portion of the second layer that is within the fourth scan region; and
determining a second alignment factor based upon the third scan result and the fourth scan result.

12. The method of claim 11, comprising:
utilizing the first alignment factor and the second alignment factor for determining an alignment for the first layer and the second layer.

13. The method of claim 11, wherein the first scan region is adjacent to the second scan region.

14. The method of claim 11, comprising:
refraining from evaluating regions of the first layer and the second layer that are not along the periphery.

15. The method of claim 11, wherein the first scan region pair, the second scan region pair, and one or more other scan region pairs encompass a contiguous circular region along the periphery.

16. The method of claim 11, wherein the first direction is substantially opposite the second direction.

17. A method for scanner alignment sampling, comprising:
forming a plurality of alignment marks within a periphery of a first layer and a second layer;
for each of a first scan region pair and a second scan region pair along the periphery:
for a first scan region of the scan region pair comprising a first portion of the first layer and a first portion of the second layer, performing a first scan of the first scan region in a first direction to obtain a first scan result describing a degree of alignment between a first alignment mark that is within the first portion of the first layer and a second alignment mark that is within the first portion of the second layer;
for a second scan region of the scan region pair comprising a second portion of the first layer and a second portion of the second layer, performing a second scan of the second scan region in a second direction, different than the first direction, to obtain a second scan result describing a degree of alignment between a third alignment mark that is within the second portion of the first layer and a fourth alignment mark that is within the second portion of the second layer; and
determining an alignment factor for the scan region pair based upon the first scan result and the second scan result; and
determining an alignment for the first layer and the second layer based upon the alignment factor determined for the first scan region pair and the alignment factor determined for the second scan region pair.

18. The method of claim 17, wherein the first direction is substantially opposite the second direction.

19. The method of claim 17, comprising:
   identifying the first scan region pair based upon the first scan region being adjacent to the second scan region.

20. The method of claim 17, comprising:
   identifying the first scan region pair based upon the first scan region being in contact with the second scan region.

\* \* \* \* \*